United States Patent
Ellebrecht et al.

(10) Patent No.: US 6,181,570 B1
(45) Date of Patent: Jan. 30, 2001

(54) ELECTRICAL DEVICE MODULE

(75) Inventors: Friedhelm Ellebrecht, Brakel; Franz-Josef Knoop, Büren, both of (DE)

(73) Assignee: Siemens Nixdorf Informationssysteme Aktiengesellschaft, Paderborn (DE)

( * ) Notice: Under 35 U.S.C. 154(b), the term of this patent shall be extended for 0 days.

(21) Appl. No.: 09/142,544

(22) PCT Filed: Mar. 3, 1997

(86) PCT No.: PCT/DE97/00388

§ 371 Date: Sep. 10, 1998

§ 102(e) Date: Sep. 10, 1998

(87) PCT Pub. No.: WO97/34453

PCT Pub. Date: Sep. 18, 1997

(30) Foreign Application Priority Data

Mar. 13, 1996 (DE) ............................................. 196 09 855

(51) Int. Cl.[7] ...................................................... H05R 7/14
(52) U.S. Cl. ........................ 361/797; 361/788; 361/796; 361/803; 361/752
(58) Field of Search ................................... 361/752, 753, 361/797, 754, 756, 724, 725, 728–730, 788, 685–689

(56) References Cited

U.S. PATENT DOCUMENTS

| | | | |
|---|---|---|---|
| 4,702,535 | 10/1987 | Beun | 312/308 |
| 4,742,477 | 5/1988 | Phillips et al. | 364/708 |
| 5,296,748 | * 3/1994 | Wicklund et al. | 307/303.1 |
| 5,388,030 | * 2/1995 | Gasser et al. | 361/818 |
| 5,603,044 | * 2/1997 | Annapareddy et al. | 395/800 |
| 5,668,696 | * 9/1997 | Schmitt | 361/685 |

FOREIGN PATENT DOCUMENTS

| | | |
|---|---|---|
| 26 52 933 | 5/1978 | (DE). |
| 42 23 935 | 1/1994 | (DE). |
| 44 06 520 | 4/1995 | (DE). |
| 44 09 024 | 8/1995 | (DE). |

* cited by examiner

Primary Examiner—Jeffrey Gaffin
Assistant Examiner—Tuan Dinh
(74) Attorney, Agent, or Firm—Schiff Hardin & Waite

(57) ABSTRACT

A module of an electrical device has a printed circuit board which may be pushed into the device and plugged onto a backplane of the device. A cuboid cage is connected to the printed circuit board of the device. The cuboid cage has a backplane arranged perpendicular to the printed circuit board of the device and is connected to the circuit board by means of connectors. The backplane of the cage has its own connectors for electrical connection to separate modular cage push-in units, in the form of cards or boards, which may be inserted into the cuboid cage of the device.

5 Claims, 5 Drawing Sheets

ELECTRICAL DEVICE MODULE

BACKGROUND OF THE INVENTION

The invention relates to a module of an electrical device, and more particularly to an electrical device having a printed circuit board which can be pushed into the device and plugged onto a backplane of the device.

Electrical or electronic devices such as data processing devices, for example, usually comprise a number of modules which are inserted as push-in units into a device chassis and are connected to a backplane of the device by means of connectors. The printed circuit boards to be pushed in have a number of different standardized formats. It has also become common practice to construct certain units or modules using printed circuit boards in a particular format. If such modules with printed circuit boards in different formats are to be used in a device, then appropriate guides for such differently sized modules have to be provided in the device chassis. In devices with different fittings, this leads to increased production costs owing to the chassis being constructed differently, and usually hampers accessibility of the modules for maintenance purposes.

SUMMARY OF THE INVENTION

One object of the invention is to provide a module wherein printed circuit boards or cards of different formats can be inserted into a standard device chassis. Another object of the invention is to provide such a module wherein the printed circuit boards or cards may be fitted or inserted and removed easily from the standard device chassis.

The invention achieves these and other objects in that a cuboid cage is connected to the printed circuit board. The cage has a backplane arranged perpendicular to the printed circuit board and electrically connected to the latter by means of connectors. The backplane of the cage has its own connectors for electrical connection to push-in units, in the form of cards or boards, which can be inserted into the cage.

Like any other printed circuit board, the printed circuit board with the cage attached can also be pushed into and withdrawn from the device chassis. The cage preferably has guides for inserting the push-in units in a direction parallel to the device printed circuit board. This means that the push-in units can be withdrawn from the cage from the same side that the printed circuit board are withdrawn from the device chassis. However, the push-in units can therefore also be withdrawn from or pushed into the cage without the device printed circuit board having to be withdrawn from the device chassis.

The push-in units can be formed from boards which are positioned inside the cage parallel to the printed circuit board. The cage can, however, also have at least one push-in unit compartment for holding a subsidiary module having a module backplane, which is positioned perpendicular to the device printed circuit board and to the backplane of the cage. The module backplane can be plugged onto the backplane of the cage. The subsidiary module can also have one or more module boards which can be plugged onto the module backplane and are positioned parallel to the printed circuit board and perpendicular to the backplane of the cage. The subsidiary module is pushed into or withdrawn from the cage as an entity parallel to the direction in which the device printed circuit board is inserted. In contrast the insertion direction of the module boards for connection to the module backplane when the modules are installed is perpendicular to the direction in which the device printed circuit board is inserted.

The subsidiary module preferably has a box-shaped open casing with a rectangular base, two mutually parallel side walls and an end frame positioned transversely with respect to the side walls. The module backplane is arranged in the casing parallel to the base and has connectors at the top for connection to the module boards. The module boards have, on one longitudinal edge, a mating connector for connection to the module backplane and, on one edge perpendicular to the latter, a front panel, so that the front panels of the module boards plugged onto the module backplane close off the end frame. Hence, the module can be pushed into the cage as an entity, the closed metallic wall formed by the front panels completing the shield provided by the cage. Construction of the invention described above permits PC AT Standard cards to be pushed into the cage and therefore into the device chassis. These PC AT Standard cards are typically pushed in or inserted in a direction essentially perpendicular to the direction in which the printed circuit board is pushed into the device chassis. This construction also permits these PC AT Standard cards to be pushed into the cage and therefore into the device chassis in the form of a position subsidiary module.

BRIEF DESCRIPTION OF THE DRAWINGS

Other features and advantages of the invention emerge from the following description, which explains the invention using an exemplary embodiment in conjunction with the enclosed drawings, in which.

DETAILED DESCRIPTION OF THE PRESENTLY PREFERRED EMBODIMENTS

Figure 1:
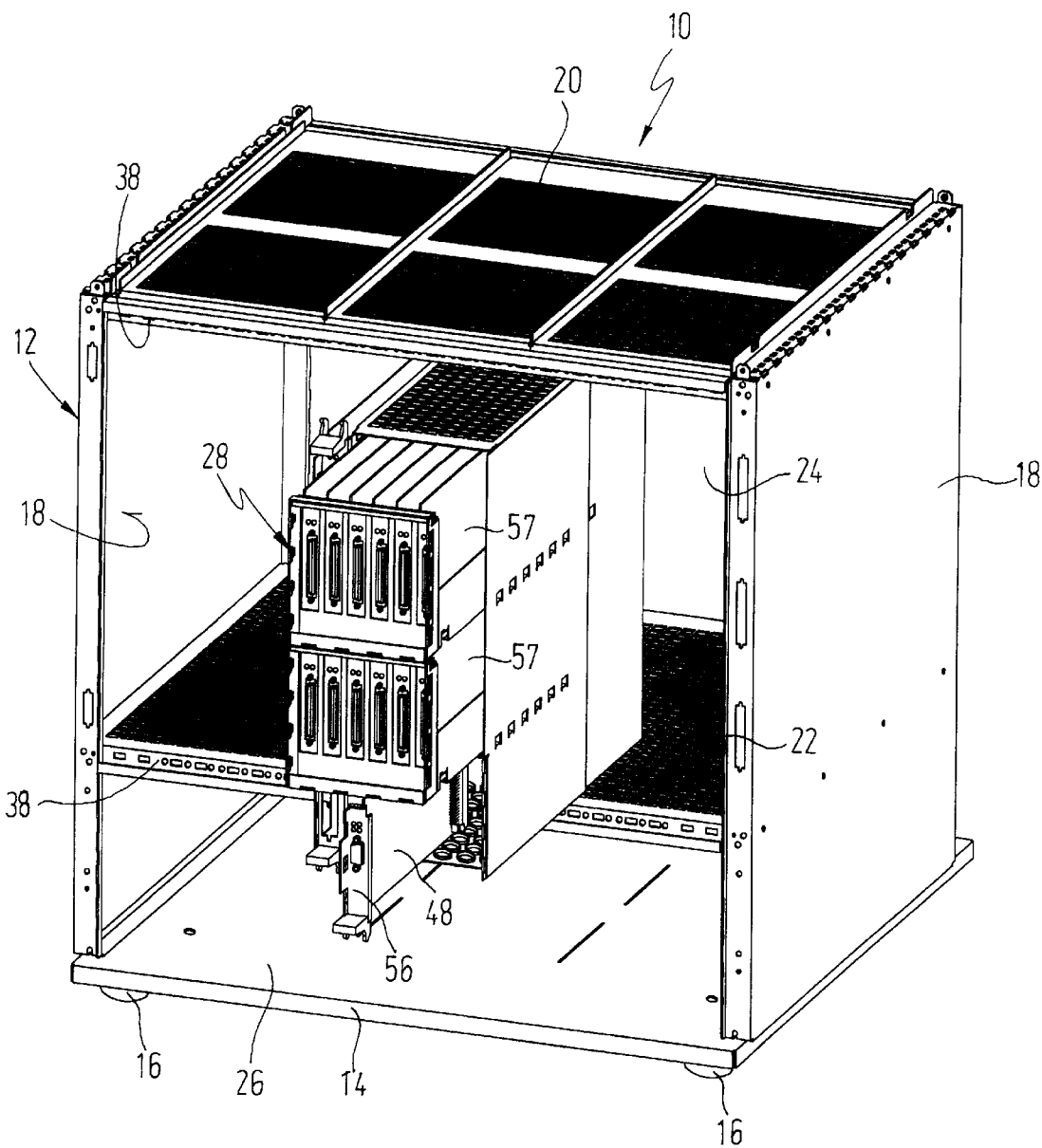
FIG. 1 shows a schematic perspective front view of a device chassis with a module according to the invention.

A device chassis, generally designated as 10, in FIG. 1 comprises a cuboid open frame 12, with metal profiles which are bolted or welded to one another. The frame 12 is fastened to a baseplate 14 resting on feet or rollers 16. The lateral faces of the frame 12 are closed by side walls 18. The top of the frame is formed by a first guide plate 20. The frame 12 including the side walls 18, the baseplate 14, and the upper guide plate 20 define an interior of the chassis 10. A lower guide plate 22 is disposed in the interior and parallel to the upper guide plate 20. The lower guide plate 22 divides the interior into an upper chamber 24 intended for holding push-in units, and a lower chamber 26 intended for holding at least a power supply unit or other supply units. The push-in units to be inserted into the chamber 24 are usually printed circuit boards, whose height and width correspond to the height and depth of the chamber 24. The guides for pushing in these printed circuit boards are not illustrated. In addition, FIG. 1 shows a particular push-in unit or a particular module 28 which will be explained in more detail below.

Figure 2:
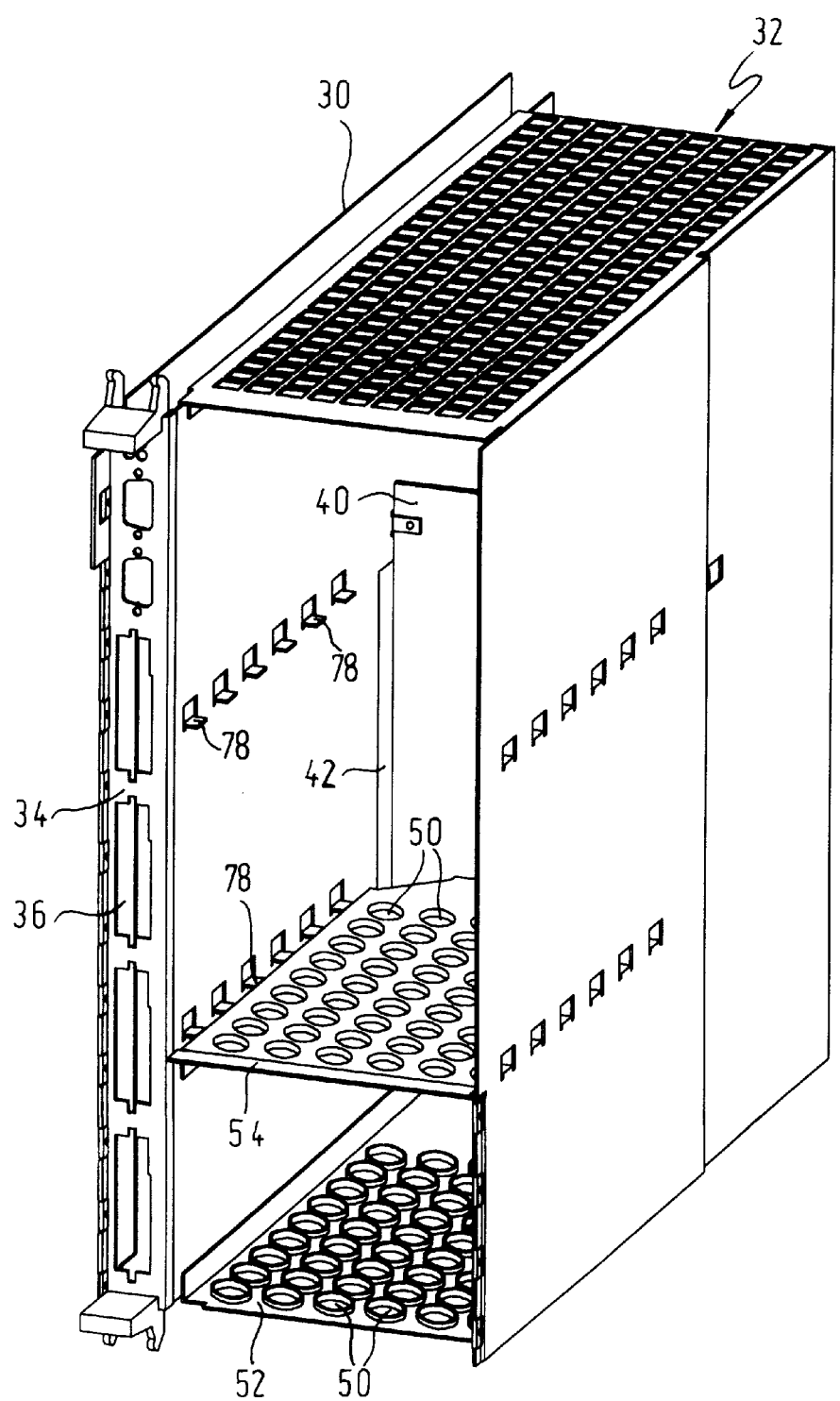
FIG. 2 shows a perspective view of the module without any push-in units.

A portion of the module 28 illustrated in FIG. 1 is shown in greater detail in FIG. 2. FIG. 2 shows a printed circuit board 30, which is intended to be pushed into the chamber 24 in the device chassis 10 and has a cuboid metal cage 32 attached to it. At its trailing edge, as seen in the direction of insertion, the printed circuit board 30 also has a panel 34 which contains openings for accommodating connectors 36 and can be bolted, at its top and bottom longitudinal end respectively, to a screw strip 38 on the chassis 10. The cage 32 serves to hold further printed circuit boards or push-in units, which have a different format than that of the printed circuit boards 30 accommodated by the main chassis 10. The cage 32 of the module 28 can accommodate these printed circuit boards of a different format which would not otherwise be able to be pushed into the housing chamber 24 in the chassis 10.

Figure 3:
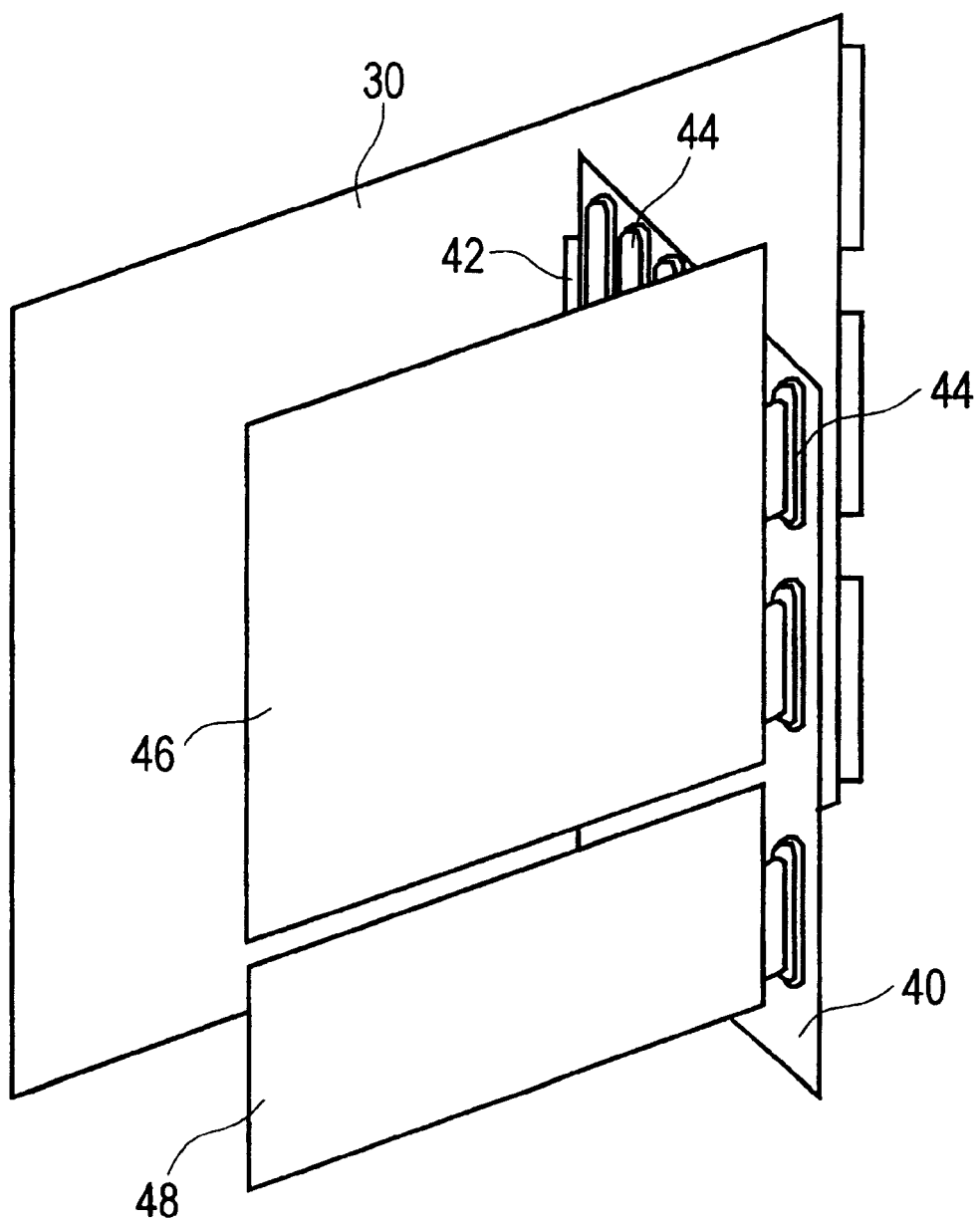
FIG. 3 shows a schematic perspective illustration of the boards, electrically connected to one another in the module, according to a first embodiment of the invention.

Inside the cage 32, there is a cage backplane 40 which is electrically connected to the printed circuit board 30 by means of a connector 42. The cage backplane 40 has its own connectors 44 which allow a plug connection to be made to push-in units or printed circuit boards 46, 48 in different formats, as illustrated in FIG. 3. In this case, FIG. 1 shows three groups of printed circuit boards which can be pushed into the cage 32 and plugged onto the backplane 40 of the cage with the aid of guides 50 formed on a cage base 52 or on intermediate bases 54 pushed into the cage base. As an alternative, FIG. 3 illustrates only two groups of boards. As shown in FIG. 1, the cage push-in units 46 can each have panels 56 on their trailing edges, as seen in the direction of insertion, which panels lie in a plane with the panel 34 of the printed circuit board 30 after the boards 46, 48 have been inserted. Each of the panels 56 together with the panel 34 form a closed wall which serves as a shield against radiated electromagnetic interference.

Figure 4:
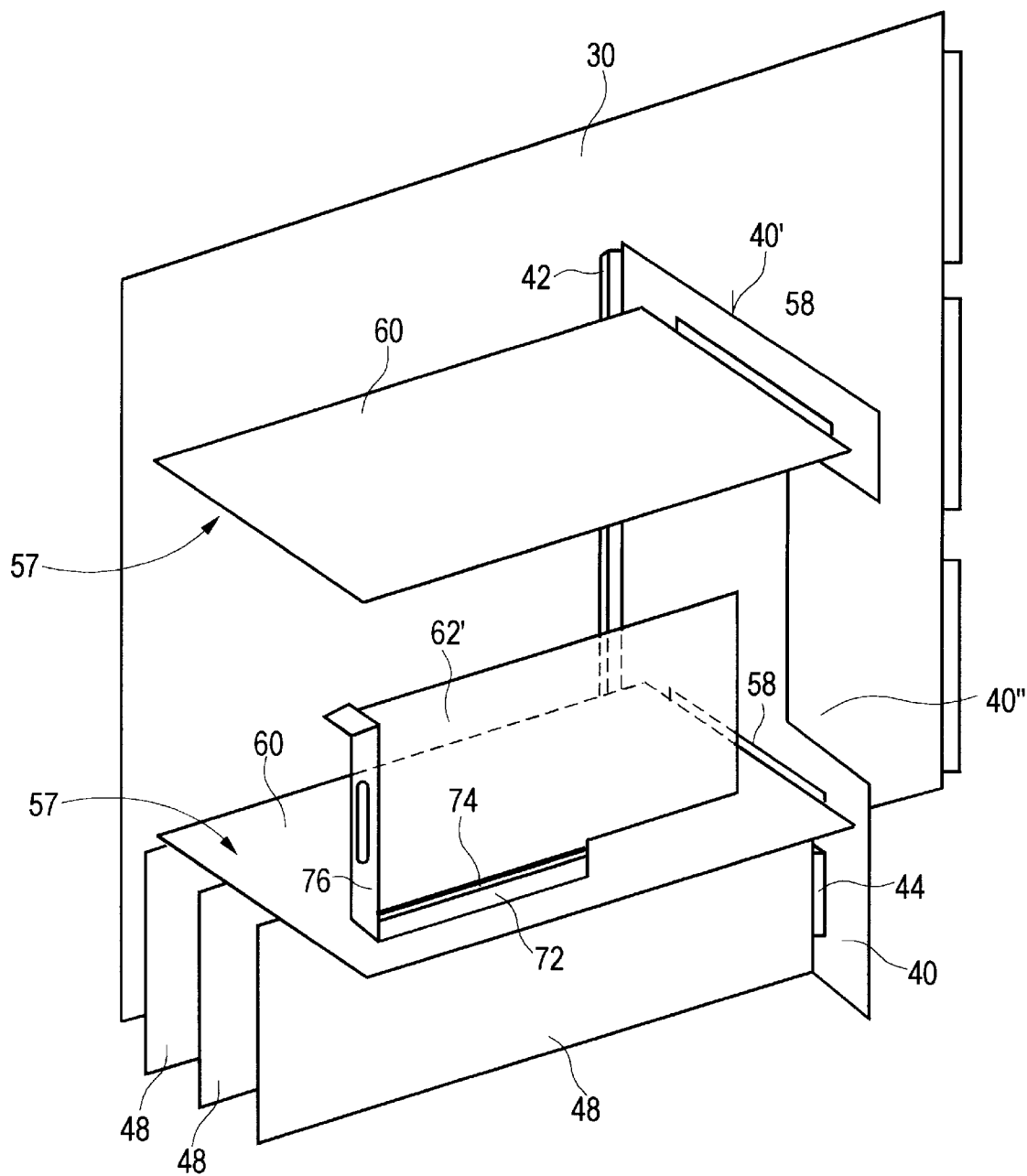
FIG. 4 shows an illustration, corresponding to FIG. 3, of the boards of the module according to a second embodiment of the invention.

The particular way in which the modules are constructed may require the boards to be inserted inside the cage in a different manner. FIGS. 1 and 4 show an alternative embodiment in which two subsidiary modules 57 are plugged onto the backplane 40 of the cage. The two subsidiary modules 57 comprise a module backplane 60 plugged onto the backplane 40 of the cage by means of a connector 58, the module backplane 60 being positioned perpendicular both to the printed circuit board 30 and to the backplane 40 of the cage. The module backplane 60 also has a plurality of cards 62 which are in turn positioned parallel to the printed circuit board 30.

Figure 5:
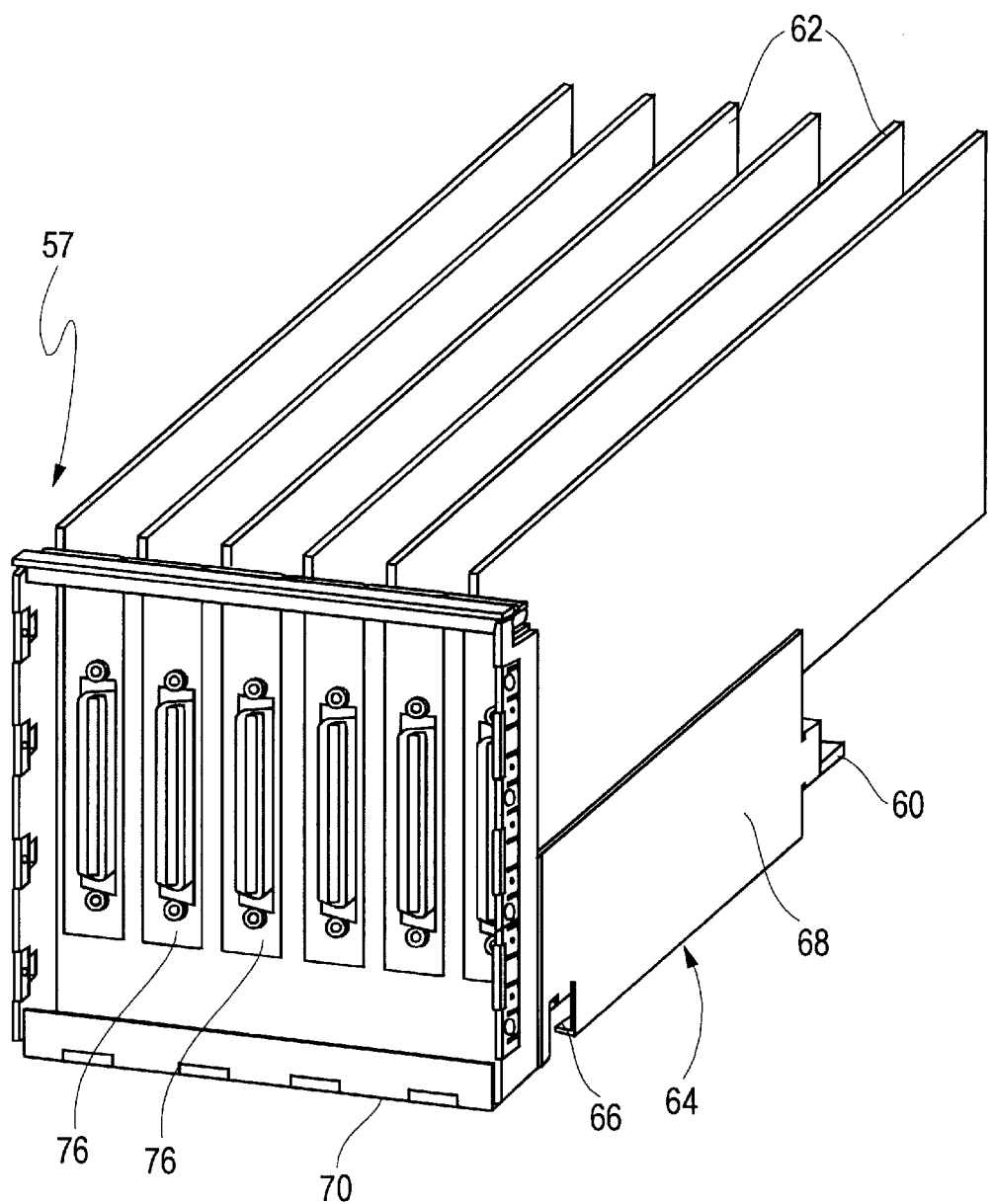
FIG. 5 shows a perspective illustration of a subsidiary module.

According to FIG. 5, the subsidiary modules 57 in this case comprise a box-shaped open casing, generally designated as 64, with a rectangular base 66, two mutually parallel side walls 68 (only one of which can be seen in FIG. 5) and an end frame 70 positioned transverse with respect to the side walls. The module backplane 60 is arranged parallel to the base 66 in the box-shaped casing 64 and has connectors 72 (FIG. 4) at the top for connection to the module boards 62, which are PC AT Standard cards, for example. These each have, on one of their longitudinal edges, a mating connector 74 for plugging into the connector 72 on the module backplane 60 and, on an edge perpendicular to the latter, a front panel 76. The front panels 76 of the module boards 62 plugged onto the module backplane 60 close off the end frame 70, as shown in FIG. 5. The module casings can be pushed into the cage 32 on guides formed from tabs 78 bent inwards in the side walls of the cage (FIG. 2). As FIG. 5 shows, the depth of the box-shaped casing 64 is matched to short format PC AT module boards 62'. In order to be able to use long format PC AT module boards 62 as well, the backplane 40 of the cage is kept low at the board slots provided, as shown in FIG. 4 at 40', or is provided with a cutout 40".

As shown in the above description, subsidiary modules with cards in a completely different format than that of the printed circuit boards pushed into the device chassis can be housed in the cage 32 without having to alter the chassis overall. The cage 32 itself can be treated as a push-in unit in the chassis 10. This solution makes it possible to construct devices having different fittings using the same chassis, in which the individual modules and subsidiary modules can nevertheless be fitted and removed in an extremely simple manner. This reduces not only the production costs but also the amount of time required for maintenance tasks.

It should be understood that various changes and modifications to the presently preferred embodiments described herein will be apparent to those skilled in the art. Such changes and modifications may be made without departing from the scope and spirit of the invention and without diminishing its attendant advantages. It is, therefore, intended that such changes and modifications be covered by the appended claims.

What is claimed is:

1. An electrical device module comprising:
   a device printed circuit board pushed into the device and plugged onto a backplane of the device;
   a cuboid cage fastened to the device printed circuit board, the cage having a backplane arranged perpendicular to the device printed circuit board and connected to the device printed circuit board by means of at least one first connector, the backplane of the cage also having at least one second connector;
   one or more cage push-in units inserted into the cage and electrically connected to the at least one second connector, the cage push-in units being of a format different than that of the device printed circuit board.

2. The module as claimed in claim 1, wherein the cage has guides for inserting the push-in units in a direction parallel to the device printed circuit board.

3. The module as claimed in claim 1, wherein the cage has at least one push-in unit compartment for holding a subsidiary module having a module backplane positioned perpendicular to the device printed circuit board and to the backplane of the cage, the subsidiary module being plugged onto the cage backplane and having module boards plugged onto the module backplane, the module boards positioned parallel to the device printed circuit board and perpendicular to the backplane of the cage.

4. An electrical device module comprising:
   a device printed circuit board pushed into the device and plugged onto a backplane of the device;
   a cuboid cage fastened to the device printed circuit board, the cage having a backplane arranged perpendicular to the device printed circuit board and connected to the device printed circuit board by means of at least one first connector, the backplane of the cage also having at least one second connector;
   one or more cage push-in units, in the form of cards or boards, inserted into the cage and electrically connected to the least one second connector, the cage push-in units being of a format different than that of the device printed circuit board;
   at least one push-in unit compartment for holding a subsidiary module having a module backplane positioned perpendicular to the device printed circuit board and to the backplane of the cage, the subsidiary module being plugged onto the cage backplane and having module boards plugged onto the module backplane, the module boards positioned parallel to the device printed circuit board and perpendicular to the backplane of the cage; and a box-shaped open casing with a rectangular base, two mutually parallel side walls and an end frame positioned traverse to the side walls, the module backplane being arranged in the casing parallel to the base and having connectors for connection to the module boards.

5. The module as claimed in 4, wherein the module boards each have, on one longitudinal edge, a mating connector for connection to the module backplane and, on one edge perpendicular to the the module backplane, a front panel so that the front panels of the module boards plugged onto the module backplane close off the end frame.

* * * * *